United States Patent [19]

vanRun

[11] Patent Number: 4,474,641
[45] Date of Patent: Oct. 2, 1984

[54] METHOD OF DRAWING A SILICON ROD

[75] Inventor: Adrianus M. J. G. vanRun, Eindhoven, Netherlands

[73] Assignee: U.S. Philips Corporation, New York, N.Y.

[21] Appl. No.: 362,582

[22] Filed: Mar. 29, 1982

[30] Foreign Application Priority Data

Apr. 29, 1981 [NL] Netherlands ............... 8102101

[51] Int. Cl.³ .................................. C30B 15/10
[52] U.S. Cl. .................. 156/617 SP; 156/DIG. 83
[58] Field of Search ............ 422/249; 156/617 SP, 156/DIG. 83

[56] References Cited

U.S. PATENT DOCUMENTS 3,582,287  6/1971  Capita ..................... 156/617 SP
3,929,557  12/1975 Goodrum ..................... 422/249
4,344,815  8/1982  Cazarra et al. ............. 156/617 SP

FOREIGN PATENT DOCUMENTS 1354495  7/1971  United Kingdom .......... 156/617 SP

Primary Examiner—Hiram H. Bernstein
Attorney, Agent, or Firm—Paul R. Miller

[57] ABSTRACT

The invention relates to a method of drawing a monocrystalline silicon rod from a silicon melt contained in a quartz crucible. In the method according to the invention, the quartz crucible has an internal cross-section which decreases gradually downwards. This technique obtains silicon rods with an oxygen content which is constant throughout their length. Upon further processing the oxygen forms oxygen precipitates which are removed by gettering.

1 Claim, 1 Drawing Figure

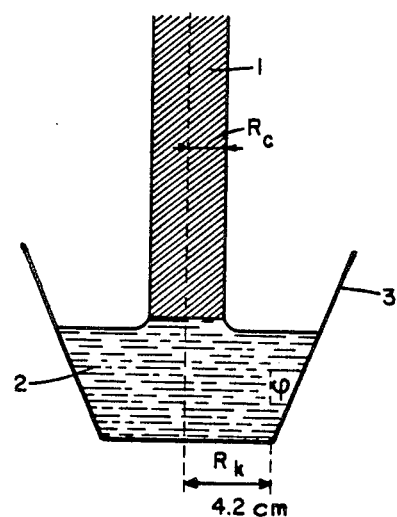

METHOD OF DRAWING A SILICON ROD

The invention relates to a method of drawing a monocrystalline silicon rod from a silicon melt present in a quartz crucible, and to a semiconductor device manufactured from the silicon rod.

Silicon slices which are used in the manufactured of semiconductor devices are manufactured from monocrystalline silicon rods.

In the manufacture of semiconductor devices from silicon slices, it is of great importance that undesired impurities should occur in the silicon as little as possible.

It is known that undesired impurities, notably metallic impurities, are gettered (gettered intrinsically) by means of oxygen precipitates in the silicon slice.

These oxygen precipitates are formed during thermal treatments of the slices, which treatments are usual in the manufacture of semiconductor devices. The oxygen required for this purpose is taken up during drawing of the silicon rod from the melt by reaction of the molten silicon with the quartz crucible. The oxygen taken up in the melt is incorporated in the crystallizing rod or disappears as silicon monoxide by evaporation via the free surface of the silicon melt.

It has been found that the oxygen content in a drawn rod varies from approximately $10^{18}$ atoms per cm$^3$ at the beginning near the seed to approximately $5 \times 10^{17}$ atoms per cm$^3$ at the end of the rod (measured by means of infrared spectroscopy according to Kaiser and Keck, J. Appl. Phys. 28, 882 (1957)), at which concentration no or only a slight pecipitation occurs. So at this last-mentioned oxygen concentration, hardly any gettering by means of oxygen precipitation occurs any more. As a result of the thus occurring variation in oxygen concentration in the rod, important differences in quality may occur between semiconductor devices which are manufactured from different slices.

It is therefore desirable to draw silicon rods with oxygen contents above that concentration at which oxygen precipitates start to occur to an important extent, i.e. above approximately $7 \times 10^{17}$ atoms per cm$^3$, preferably above $10^{18}$ atoms per cm$^3$. At most $2 \times 10^{18}$ atoms of oxygen per cm$^3$ can be incorporated in monocrystalline silicon.

One of the objects of the invention is to draw monocrystalline silicon rods with a concentration of oxygen in the silicon which is as homogeneous as possible and which can be controlled.

The variation in the content of oxygen in monocrystalline silicon rods is probably associated with the fact that the crucible used in the drawing process has a cylindrical shape. As a result of this the contact area between the silicon melt and the crucible wall during drawing decreases as the level of the silicon melt in the crucible drops, while the free surface of the silicon melt remains constant. As a result of this less oxygen will dissolve in the melt from the crucible wall, while the possibility of evaporation of silicon monoxide from the melt remains constant. The result is that during drawing a progressively decreasing concentration of oxygen is incorporated in the rod.

The invention is based inter alia on the recognition of the fact that an important improvement as regards the axial homogeneity of the oxygen content in the drawn rod can be obtained by varying the conventional shape of the crucible.

Therefore, the method according to the invention mentioned in the opening paragraph is characterized in that the silicon rod is drawn from a crucible which has the shape of a truncated cone.

A rod thus drawn shows a more homogeneous content of oxygen than can be produced by conventional methods.

Preferably the relationship holds $$\sin \phi = 1 - (R_{c2}/R_{k2}),$$

wherein
$2\phi$ is the apical angle of the truncated cone
$R_c$ is the radius of the rod and
$R_k$ is the radius of the bottom of the crucible.

With the value of the sin $\phi$ the contant concentration of oxygen in the rod can also be adjusted.

Very good results are obtained when the ratio $R_c/R_k$ is smaller than 0.95.

The invention furthermore relates to a semiconductor device manufactured from a silicon rod drawn by means of the method according to the invention. Such semiconductor devices are distinguished by good quality and reproducible properties.

An embodiment of the invention will now be described in greater detail with reference to an example and the accompanying drawing.

The sole FIGURE is a diagrammatic sectional view of a part of a device for carrying out the method according to the invention.

In this example, a monocrystalline silicon rod 1 is drawn from a silicon melt 2 contained in a quartz crucible 3.

According to the invention the silicon rod 1 is drawn from a crucible 2 having the shape of a truncated cone.

The melt 2 is constantly stirred thoroughly by rotating the rod 1 and the crucible 3 in opposite directions.

The radius $R_c$ of the cross-section of the rod 1 is, for example, 3.75 cm and the radius $R_k$ of the bottom of the crucible 3 is 4.2 cm, and $\phi$ is equal to 11.7°. The relation between the apical angle $2\phi$ of the cone, $R_c$ and $R_k$ then satisfies the equation $$\sin \phi = 1 - (R_{c2}/R_{k2}).$$

When the maximum concentration of oxygen in the melt is $2 \times 10^{18}$ atoms per cm$^3$, then the oxygen concentration in the rod is constantly equal to approximately $1 \times 10^{18}$ atoms per cm$^3$ throughout its length.

The oxygen content in the drawn rod only depends to a small extent on the growth rate. This is, for example, 2 mm per minute. As a result of the downwardly decreasing internal cross-section of the crucible, the growth rate of the rod, when the drawing speed is constant, will increase due to the accelerating rate at which the level of the melt in the crucible drops. In order to keep the diameter of the rod constant, the growth rate during drawing can be kept constant by reducing the drawing rate, but alternatively the drawing rate may be kept constant or the growth rate may be increased, or an intermediate form between these two methods may be chosen. This can be done automatically by means of a conventional device by which the rod diameter is kept constant.

The invention is not restricted to the example described. Very good results are obtained with a ratio $R_c/R_k$ which is smaller than 0.95.

In a conventional manner, slices are sawn from the drawn silicon rod, from which slices semiconductor devices, for example, diodes, transistors and integrated circuits, are made which show good and reproducible properties.

What is claimed is:

1. In a method of drawing a moncrystalline silicon rod from a silicon melt in a quartz crucible, the improvement comprising the steps of shaping a quartz crucible into the form of a truncated cone, wherein said truncated cone has an apical angle $2\phi$, a silicon rod to be drawn has a radius $R_c$, and said crucible has a bottom with a radius $R_k$ with such parameters bearing the relation $\sin \phi = 1 - (R_{c2}/R_{k2})$, and wherein said ratio $R_c/R_k$ is smaller than 0.95.

* * * * *

UNITED STATES PATENT AND TRADEMARK OFFICE
CERTIFICATE OF CORRECTION

PATENT NO. : 4,474,641
DATED : October 2, 1984
INVENTOR(S) : ADRIANUS M.J.G. VAN RUN It is certified that error appears in the above—identified patent and that said Letters Patent is hereby corrected as shown below:

Column 2, line 10 change "$\sin \phi=1-(Rc_2/Rk_2)$" to
--$\sin \phi=1-(Rc^2/Rk^2)$--

Column 2, line 45 change "$\sin \phi=1-(Rc_2/Rk_2)$" to
--$\sin \phi=1-(Rc^2/Rk^2)$--.

Claim 1, line 10 change "$\sin \phi=1-(Rc_2/Rk_2)$" to
--$\sin \phi=1-(Rc^2/Rk^2)$--.

Signed and Sealed this

Fifth Day of November 1985

[SEAL]

Attest:

DONALD J. QUIGG

Attesting Officer

Commissioner of Patents and Trademarks